(12) United States Patent
Lai

(10) Patent No.: US 12,665,041 B2
(45) Date of Patent: Jun. 23, 2026

(54) SEMICONDUCTOR MEMORY DEVICE AND TEST METHOD THEREOF

(71) Applicant: Winbond Electronics Corp., Taichung City (TW)

(72) Inventor: Chih-Chiang Lai, Hsin-Chu (TW)

(73) Assignee: Winbond Electronics Corp., Taichung City (TW)

( * ) Notice: Subject to any disclaimer, the term of this patent is extended or adjusted under 35 U.S.C. 154(b) by 161 days.

(21) Appl. No.: 18/826,151

(22) Filed: Sep. 5, 2024

(65) Prior Publication Data

US 2025/0124996 A1 Apr. 17, 2025

(30) Foreign Application Priority Data

Oct. 16, 2023 (TW) .................................. 112139363

(51) Int. Cl.
| | |
|---|---|
| *G11C 11/00* | (2006.01) |
| *G11C 11/4074* | (2006.01) |
| *G11C 11/408* | (2006.01) |
| *G11C 29/12* | (2006.01) |

(52) U.S. Cl.
CPC .... *G11C 29/12005* (2013.01); *G11C 11/4074* (2013.01); *G11C 11/4087* (2013.01); *G11C 2029/1202* (2013.01)

(58) Field of Classification Search
CPC .......... G11C 29/12005; G11C 11/4074; G11C 11/4087; G11C 2029/1202
See application file for complete search history.

(56) References Cited

U.S. PATENT DOCUMENTS

| | | | | |
|---|---|---|---|---|
| 5,818,766 | A * | 10/1998 | Song ...................... | G11C 5/145 |
| | | | | 365/189.11 |
| 8,432,732 | B2 | 4/2013 | Li et al. | |
| 8,634,264 | B2 | 1/2014 | Yamada | |
| 11,062,776 | B2 * | 7/2021 | Shin ...................... | G11C 16/12 |
| 2010/0125429 | A1 | 5/2010 | Yamada | |
| 2014/0016414 | A1 * | 1/2014 | Tsai ................... | G11C 13/0064 |
| | | | | 365/185.18 |

FOREIGN PATENT DOCUMENTS

| | | |
|---|---|---|
| TW | 201530552 | 8/2015 |

* cited by examiner

*Primary Examiner* — Pho M Luu
(74) *Attorney, Agent, or Firm* — JCIPRNET

(57) ABSTRACT

A semiconductor memory device and a test method thereof are provided. The semiconductor memory device includes a plurality of word lines, a row decoder, a first voltage pump circuit, a first programmable current comparator and a control circuit. The row decoder decodes a row address data and accordingly selects a test word line to be electrically connected to a first test path. The first voltage pump circuit is configured on the first test path and applies a test voltage to the test word line. The first programmable current comparator compares a test current flowing through the first test path with a programmable reference current to provide a test result signal. The control circuit uses the word lines as the test word line sequentially, compares the corresponding test current with the programmable reference current and determines whether the test word line is defective according to the test result signal.

20 Claims, 7 Drawing Sheets

100

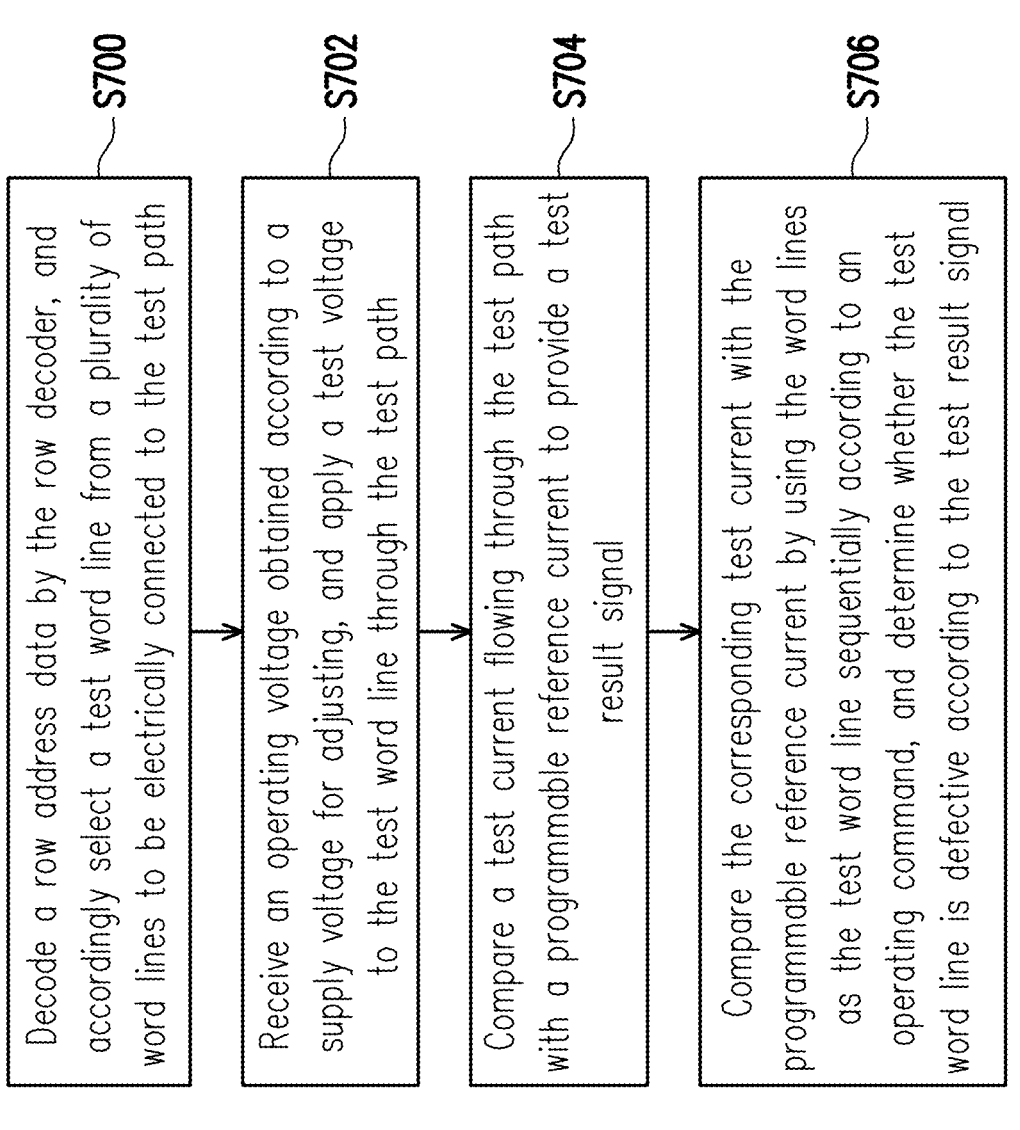

S700

Decode a row address data by the row decoder, and accordingly select a test word line from a plurality of word lines to be electrically connected to the test path

S702

Receive an operating voltage obtained according to a supply voltage for adjusting, and apply a test voltage to the test word line through the test path

S704

Compare a test current flowing through the test path with a programmable reference current to provide a test result signal

S706

Compare the corresponding test current with the programmable reference current by using the word lines as the test word line sequentially according to an operating command, and determine whether the test word line is defective according to the test result signal

FIG. 7

SEMICONDUCTOR MEMORY DEVICE AND TEST METHOD THEREOF

CROSS-REFERENCE TO RELATED APPLICATION

This application claims the priority benefit of Taiwan application serial no. 112139363, filed on Oct. 16, 2023. The entirety of the above-mentioned patent application is hereby incorporated by reference herein and made a part of this specification.

BACKGROUND

Technical Field

The disclosure relates to a memory test technology, and particularly relates to a semiconductor memory device and a test method used therein.

Description of Related Art

Word line leakage current (including leakage current from word line to word line, word line to bit line, and word line to storage capacitor) is a common defect in a manufacturing process of dynamic random access memory (DRAM), which easily causes quality problems. Compared with a low-impedance word line leakage current (with a high leakage current value), high-impedance word line leakage current (with a low leakage current value) is difficult to be detected through a conventional functional test. Although the high-impedance word line leakage current may not cause immediate malfunction of a memory, once a leakage current path exists, it has a risk of transforming into the low-impedance word line leakage current after a period of use, which causes rapid degradation of reliability thereof over time.

At present, in order to improve test quality and coverage, direct current (DC) test is an alternative solution, and a voltage may be directly applied to a circuit board from the outside to measure the word line leakage current, so as to detect the high-impedance word line leakage current. However, when the DC test is used, the DC test and the functional test need to be switched alternately. A switching process is very time-consuming, and the DC test cannot be introduced into standard test projects for mass production.

SUMMARY

The disclosure is directed to a semiconductor memory device and a test method thereof, which are adapted to detect a high-impedance word line leakage current in a functional test.

The disclosure provides a semiconductor memory device including a plurality of word lines, a row decoder, a first voltage pump circuit, a first programmable current comparator and a control circuit. The row decoder is coupled between the word lines and a first test path, decodes a row address data and accordingly selects a test word line from the word lines to be electrically connected to the first test path. The first voltage pump circuit is configured on the first test path, receives an operating voltage for adjusting, and applies a test voltage to the test word line. The first programmable current comparator is coupled to the first test path, transmits the operating voltage to the first voltage pump circuit according to a received supply voltage, and compares a test current flowing through the first test path with a programmable reference current to provide a test result signal. The control circuit is coupled to the row decoder and the first programmable current comparator, compares the corresponding test current with the programmable reference current by using the word lines as the test word line sequentially through the first programmable current comparator according to an operating command, and determines whether the test word line is defective according to the corresponding test result signal.

The disclosure provides a test method of a semiconductor memory device including the following steps: decoding a row address data by a row decoder, and accordingly selecting a test word line from a plurality of word lines to be electrically connected to a test path; receiving an operating voltage obtained according to a supply voltage for adjusting, and applying a test voltage to the test word line through the test path; comparing a test current flowing through the test path with a programmable reference current to provide a test result signal; and comparing the corresponding test current with the programmable reference current by using the word lines as the test word line sequentially according to an operating command, and determining whether the test word line is defective according to the test result signal.

Based on the above description, the semiconductor memory device and the test method thereof of the disclosure are adapted to simplify the test of high-impedance word line leakage current into functional test, which overcomes the limitation of alternately switching between DC test and functional test. In this way, not only a test time is greatly reduced, but also the DC test may be introduced into standard test projects for mass production to filter out defective components, so as to improve product reliability.

To make the aforementioned more comprehensible, several embodiments accompanied with drawings are described in detail as follows.

BRIEF DESCRIPTION OF THE DRAWINGS

FIG. 7 is a flowchart of a test method for a semiconductor memory device according to an embodiment of the disclosure.

DESCRIPTION OF THE EMBODIMENTS

Figure 1:
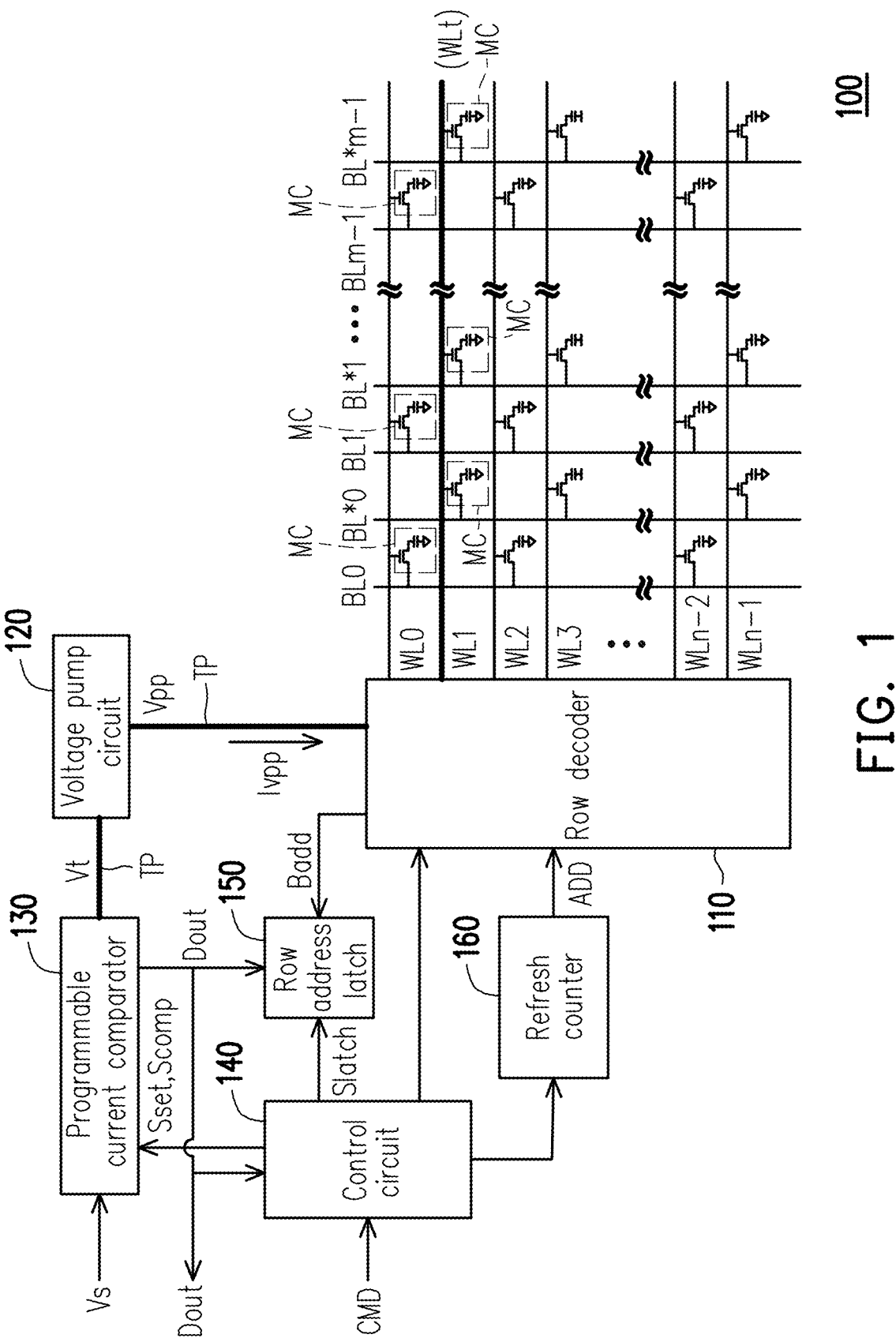
FIG. 1 is a schematic circuit diagram of a semiconductor memory device according to an embodiment of the disclosure.

Referring to FIG. 1, a semiconductor memory device 100 includes n word lines WL0-WLn−1, a row decoder 110, a voltage pump circuit 120, a programmable current comparator 130, a control circuit 140, and a row address latch 150 and a refresh counter 160. The word lines WL0-WLn−1 are respectively arranged across m bit line pairs composed of bit lines BL0-BLm−1 and BL*0~BL*m−1, and memory cells MC are configured at intersections of the word lines and the bit lines. These memory cells M may form, for example, a dynamic random access memory (DRAM) array. n and m are respectively positive integers greater than 1.

The row decoder 110 is coupled between the word lines WL0-WLn−1 and a test path TP. The row decoder 110 may decode a row address data ADD, and select a test word line WLt from the word lines WL0-WLn−1 according to a decoding result to be electrically connected to the test path TP. It should be noted that although FIG. 1 illustrates the situation that the word line WL1 is selected as the test word line WLt, this situation is only an example, and the word line used as the test word line WLt changes along with increment of the row address data ADD.

The voltage pump circuit 120 is configured on the test path TP. The voltage pump circuit 120 may receive an operating voltage Vt for adjustment, so as to apply a test voltage Vpp to the test word line WLt. For example, the voltage pump circuit 120 may increase the operating voltage Vt in response to a specific oscillation signal, thereby generating the test voltage Vpp (for example, 3.3 or 3.5 volts) for applying to the test word line WLt through the test path TP.

The programmable current comparator 130 is coupled to the test path TP. The programmable current comparator 130 may transmit the operating voltage Vt to the voltage pump circuit 120 according to a received supply voltage Vs. The supply voltage Vs may be, obtained by converting a power supply voltage inside or outside the semiconductor memory device 100, which is, for example, 2.9 volts. Furthermore, the programmable current comparator 130 may compare a test current Ivpp flowing through the test path TP with a programmable reference current to provide a test result signal Dout. When the test result signal Dout is at a first logic level, it indicates that the test word line WLt is defective. When the test result signal Dout is at a second logic level, it indicates that the test word line WLt is good. It should be noted that the above-mentioned first logic level may be logic 1 or logic 0, and the second logic level may be logic 0 or 1 that is complementary to the first logic level, which is not limited by the disclosure. When the test word line WLt is good, the test current Ivpp is, for example, about 10 mA. When the test word line WLt is defective, the test current Ivpp may be increased to, for example, 20 m, 30 m, or even 100 mA.

Since the programmable current comparator 130 is located at a DC source of the internal test path TP of the semiconductor memory device 100, it may isolate noise and interference sources and focus on testing the leakage current of the test word line WLt, thereby improving test accuracy.

The control circuit 140 is coupled to the row decoder 110 and the programmable current comparator 130. The control circuit 140 may be, for example, a central processing unit (CPU), or other programmable general-purpose or special-purpose microprocessor, digital signal processor (DSP), programmable controller, application specific integrated circuits (ASICs), programmable logic device (PLD) or other similar devices.

Figure 2:
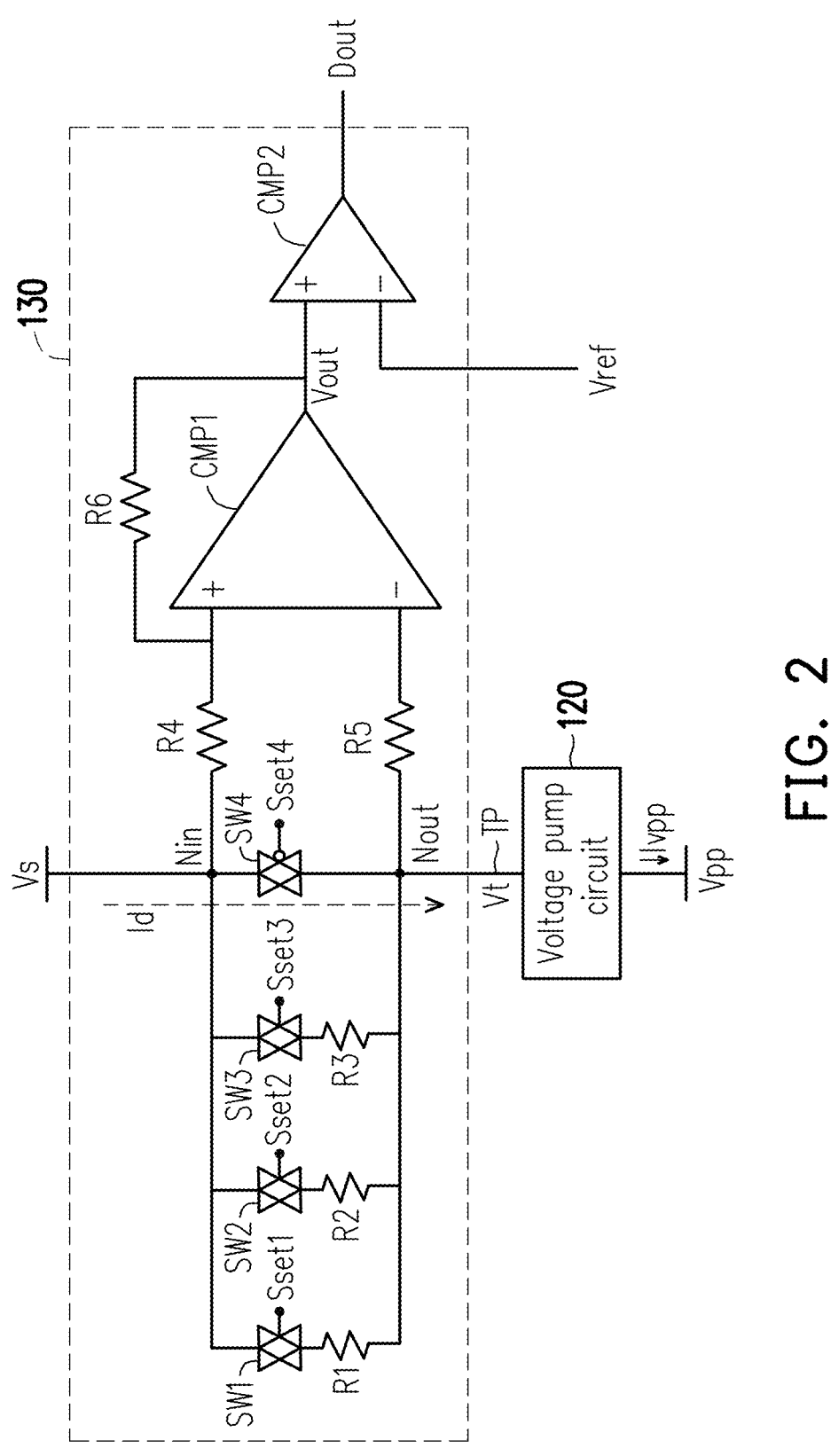
FIG. 2 is a schematic circuit diagram of a programmable current comparator according to an embodiment of the disclosure.

The programmable reference current of the programmable current comparator 130 may be adjusted in advance according to a setting signal Sset provided by the control circuit 140. The following is an example to illustrate internal details of the programmable current comparator 130. Referring to FIG. 2, the setting signal Sset provided by the control circuit 140 includes a first setting signal Sset1, a second setting signal Sset2, a third setting signal Sset3 and a fourth setting signal Sset4. The programmable current comparator 130 includes an input node Nin, an output node Nout, a first switch SW1 to a fourth switch SW4, a first resistor R1 to a sixth resistor R6, a first comparator CMP1 and a second comparator CMP2. The input node Nin receives the supply voltage Vs. The output node Nout is coupled to the test path TP and configured to output the operating voltage Vt. The first switch SW1 to the fourth switch SW4 are respectively coupled between the input node Nin and the output node Nout through different circuit paths, and are respectively controlled by the first setting signal Sset1 to the fourth setting signal Sset4 to be turned on or off. The first resistor R1 and the first switch SW1 are connected in series on a first circuit path between the input node Nin and the output node Nout. The second resistor R2 and the second switch SW2 are connected in series on a second circuit path between the input node Nin and the output node Nout. The third resistor R3 and the third switch SW3 are connected in series on a third circuit path between the input node Nin and the output node Nout. A first terminal of the fourth resistor R4 is coupled to the input node Nin. A first terminal of the fifth resistor R5 is coupled to the output node Nout. A non-inverting input terminal of the first comparator CMP1 is coupled to a second terminal of the fourth resistor R4, and an inverting input terminal thereof is coupled to a second terminal of the fifth resistor R5. A non-inverting input terminal of the second comparator CMP2 is coupled to an output terminal of the first comparator CMP1, an inverting input terminal thereof receives a reference voltage Vref (for example, 1 volt, which may also be determined by the setting signal Sset), and an output terminal is configured to output the test result signal Dout. A first terminal of the sixth resistor R6 is coupled to the non-inverting input terminal of the first comparator CMP1, and a second terminal thereof is coupled to the non-inverting input terminal of the second comparator CMP2.

In the embodiment, a voltage Vout output by the output terminal of the first comparator CMP1 may be expressed by a following equation (1):

$$Vout = Id * Rsen * (R6/R4) \tag{1}$$

Where, Id is a current flowing from the input node Nin to the output node Nout, and Rsen is an equivalent resistance between the input node Nin and the output node Nout. Table 1 below records a corresponding relationship between the first setting signal Sset1 to the fourth setting signal Sset4 and the equivalent resistance Rsen. In this example, the first resistor R1 is selected as 20 ohms, the second resistor R2 is selected as 10 ohms, the third resistor R3 is selected as 5 ohms, the fourth resistor R4 is selected as 2.5 k ohms, the fifth resistor R5 is selected as 2.5 k ohms, and the sixth resistor R6 is selected as 22.5 k ohms, but those skilled in the art may make appropriate adjustments according to their actual needs.

TABLE 1

| Sset1 | Sset2 | Sset3 | Sset4 | Rsen | Operating mode |
|-------|-------|-------|-------|------|----------------|
| 0 | 0 | 0 | 1 | N/A | No operation |
| 0 | 0 | 1 | 1 | 5.0Ω | Test mode |
| 0 | 1 | 0 | 1 | 10.0Ω | |
| 0 | 1 | 1 | 1 | 3.3Ω | |
| 1 | 0 | 0 | 1 | 20.0Ω | |
| 1 | 0 | 1 | 1 | 4.0Ω | |
| 1 | 1 | 0 | 1 | 6.7Ω | |
| 1 | 1 | 1 | 1 | 2.9Ω | |
| X | X | X | 0 | 0.0Ω | Normal mode |

In this example, when the first setting signal Sset1 to the third setting signal Sset3 are logic 1, the first switch SW1 to the third switch SW3 are turned on, and when the fourth setting signal Sset4 is logic 1, the fourth switch SW4 is turned off. On the contrary, when the first setting signal Sset1 to the third setting signal Sset3 are logic 0, the first switch SW1 to the third switch SW3 are turned off, and when the fourth setting signal Sset4 is logic 0, the fourth switch SW4 is turned on. Table 1 lists the corresponding equivalent resistance Rsen for various logical combinations of the first setting signal Sset1 to the fourth setting signal Sset4. In the normal mode when the fourth switch SW4 is turned on (the fourth setting signal Sset4 is logic 0), the input node Nin and the output node Nout are short-circuited. At this time, the word lines WL0-WLn−1 are not tested, and the supply voltage Vs is equal to the operating voltage Vt.

On the other hand, in the test mode when the fourth switch SW4 is turned off (the fourth setting signal Sset4 is logic 1), the equivalent resistance Rsen between the input node Nin and the output node Nout may change along with different logical combinations of the first setting signal Sset1 to the third setting signal Sset3. When testing the test word line WLt, the current Id is equal to the test current Ivpp, and the voltage Vout output by the output terminal of the first comparator CMP1 may be equal to the voltage value obtained by substituting the current Id into the equation (1) for calculating together with the preset equivalent resistance Rsen. Thereafter, the second comparator CMP2 compares the voltage Vout depending on the test current Ivpp with the reference voltage Vref, thereby achieving an effect equivalent to comparing the test current Ivpp with the programmable reference current. When the voltage Vout is greater than the reference voltage Vref, the test result signal Dout of the first logic level is generated. When the voltage Vout is less than the reference voltage Vref, the test result signal Dout of the second logic level is generated.

Through the circuit structure described above, the control circuit 140 may provide the setting signal Sset to the programmable current comparator 130 to adjust a test point (a level of the programmable reference current) according to different devices, memory specifications, and leakage current conditions, so as to determine an abnormal range of test current Ivpp. It should be noted that although the embodiment is described with reference to the programmable current comparator including four switches, the number of the above components is not used to limit the disclosure. Those skilled in the art may deduce the number of the above components to be less or more depending on a level requirement of the programmable reference current by referring to the teachings of the embodiment.

Referring again to FIG. 1, the row address latch 150 is coupled to the row decoder 110, the programmable current comparator 130 and the control circuit 140. When the test result signal Dout is at the first logic level (indicating that the test word line WLt is defective), the row address latch 150 may store the current row address of the row decoder 110 as a bad row address Badd in response to a latch pulse signal Slatch output by the control circuit 140.

The refresh counter 160 is coupled to the row decoder 110 and the control circuit 140. The refresh counter 160 may be used to increment the row address data ADD in the test mode, and sequentially output the incremented row address data ADD to the row decoder 110.

The control circuit 140 may, for example, enter the test mode according to an operating command CMD from an external memory controller, and compare the corresponding test current Ivpp with the programmable reference current by sequentially using the word lines WL0-WLn−1 as the test word lines WLt through the programmable current comparator 130, and determines whether the test word line WLt is defective according to the corresponding test result signal Dout.

Figure 3:
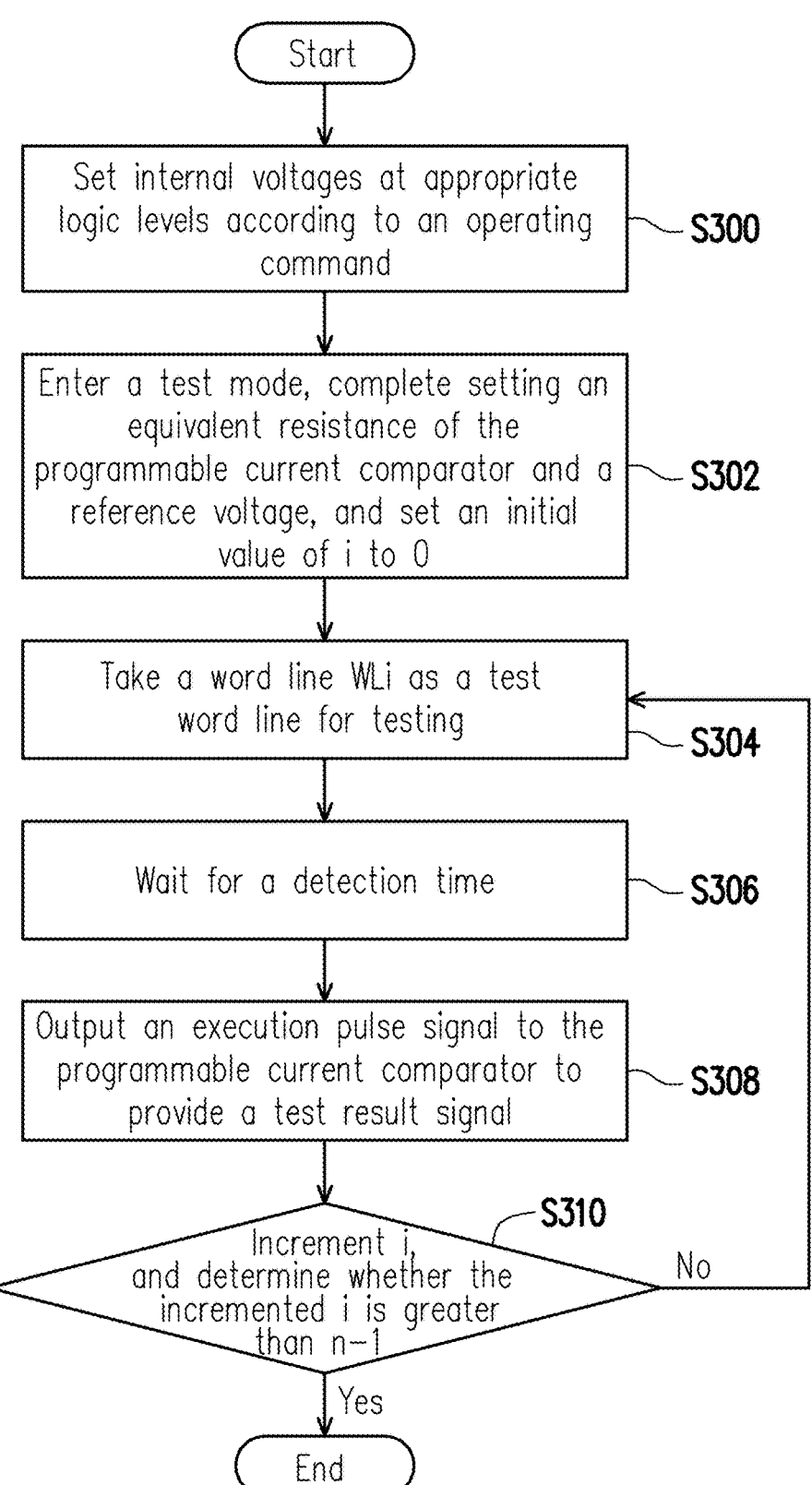
FIG. 3 is a flowchart of a test operation of a semiconductor memory device according to an embodiment of the disclosure.
Figure 4:
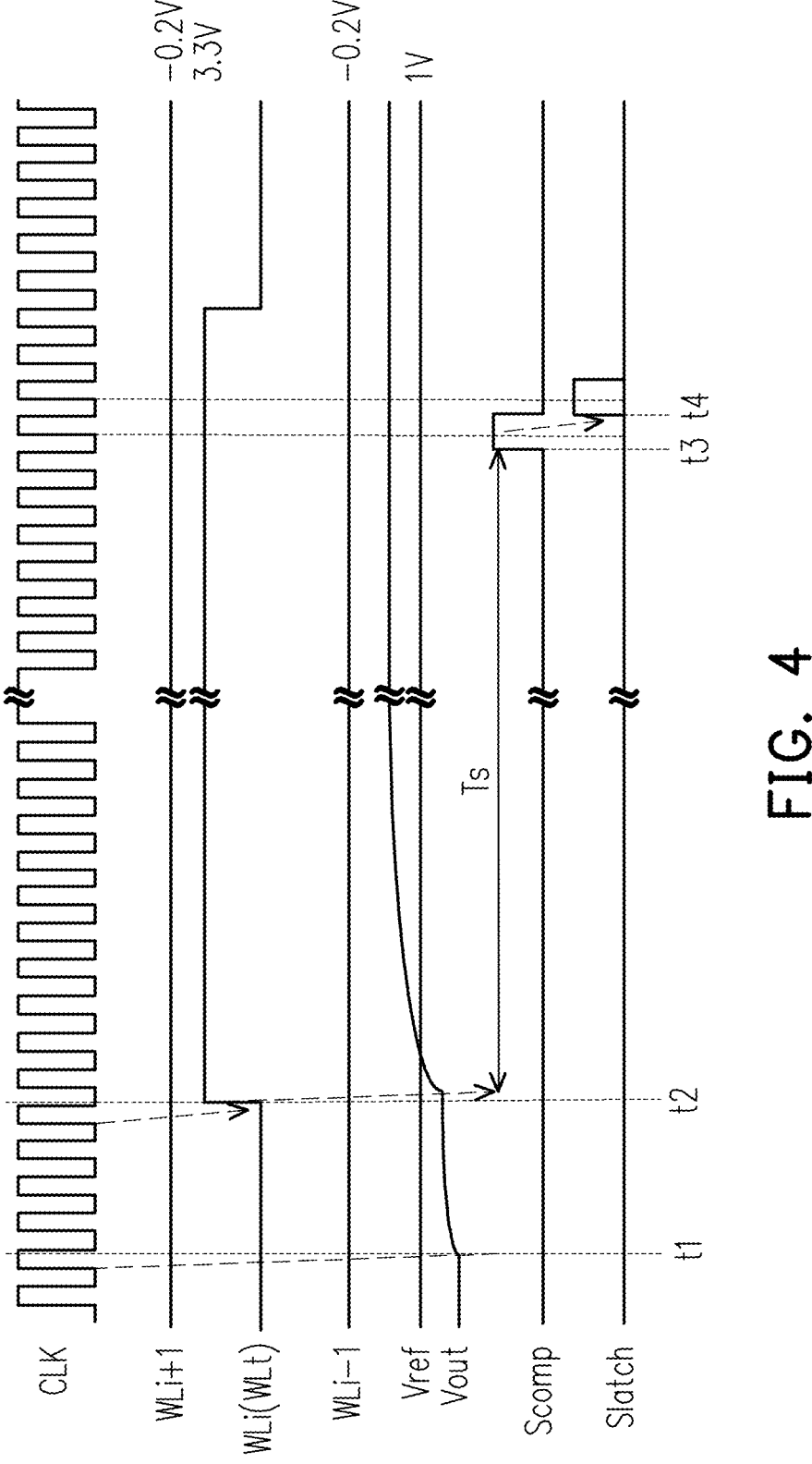
FIG. 4 is a schematic waveform diagram of a test operation of a semiconductor memory device according to an embodiment of the disclosure.

To be specific, referring to FIG. 3 and FIG. 4 at the same time, first, in step S300, the control circuit 140 may set internal voltages (including the test voltage Vpp, a word line voltage, a bit line voltage, etc.) at appropriate logic levels according to the operating command CMD. The semiconductor memory device 100 may operate in response to a clock signal CLK in FIG. 4. In step S302, at a time point t1 in FIG. 4, the control circuit 140 enters the test mode related to the word line leakage current, completes setting the equivalent resistance Rsen of the programmable current comparator 130 and the reference voltage Vref through the setting signal Sset, and sets an initial value of i to 0.

In step S304, at a time point t2 in FIG. 4, the control circuit 140 takes the word line WLi as the test word line WLt for testing. Specifically, the control circuit 140 may send a command to the refresh counter 160 to provide the row address data ADD corresponding to the word line WL0 to the row decoder 110, thereby causing the row decoder 110 to select the word line WL0 as the test word line WLt. In this way, the test voltage Vpp may be applied to the test word line WLt, and the logic level of the test word line WLt may rise to an enable level (3.3 volts). At the same time, during a test period of the test word line WLt, the control circuit 140 may control the row decoder 110 to disable the word lines WLi−1 and WLi adjacent to the test word line WLt (word line WLi). +1 to keep them at a disabled level (−0.2 volts).

In step S306, the control circuit 140 waits for a detection time Ts, for example, 10 μseconds, so that the voltage Vout in the programmable current comparator 130 reaches a steady state. Then, in step S308, at a time point t3 in FIG. 4, the control circuit 140 outputs an execution pulse signal Scomp to the programmable current comparator 130 to start comparing the voltage Vout with the reference voltage Vref through the second comparator CMP2, so as to provide the test result signal Dout. If the voltage Vout is greater than the reference voltage Vref, the control circuit 140 may receive the test result signal Dout of the first logic level. In this case, as shown in FIG. 4, at a time point t4, the control circuit 140 outputs the latch pulse signal Slatch to the row address latch 150, and uses the current row address of the row decoder 110 as the bad row address Badd for saving. If the voltage Vout is less than the reference voltage Vref, the control circuit 140 may receive the test result signal Dout of the second logic level. In this case, the control circuit 140 does not output the latch pulse signal Slatch to the row address latch 150.

In step S310, the control circuit 140 increments i (i=i+1), and determines whether the incremented i is greater than n−1. If not, the method flow returns to step S304 to continue testing a next test word line WLt (word line WL1). After repeatedly executing steps S304, S306, S308 and S310 to complete the test of all word lines WL0-WLn−1, the incremented i may be greater than n−1, and the test operation of the embodiment ends.

It should be noted that although the row address data ADD in the embodiment is provided sequentially by the refresh counter 160 according to the command from the control circuit 140. In other embodiments, the refresh counter may also be omitted and an external memory controller directly provides the row address data ADD. In addition, as shown in FIG. 1, the test result signal Dout may also be directly transmitted to the outside through input and output pins, allowing the user to directly know which bit line is defective.

Through the above-described test operations, the test for the high-impedance word line leakage current may be simplified to be performed in the functional test without the need for additional DC test. In this way, the test time may be significantly reduced.

Figure 5:
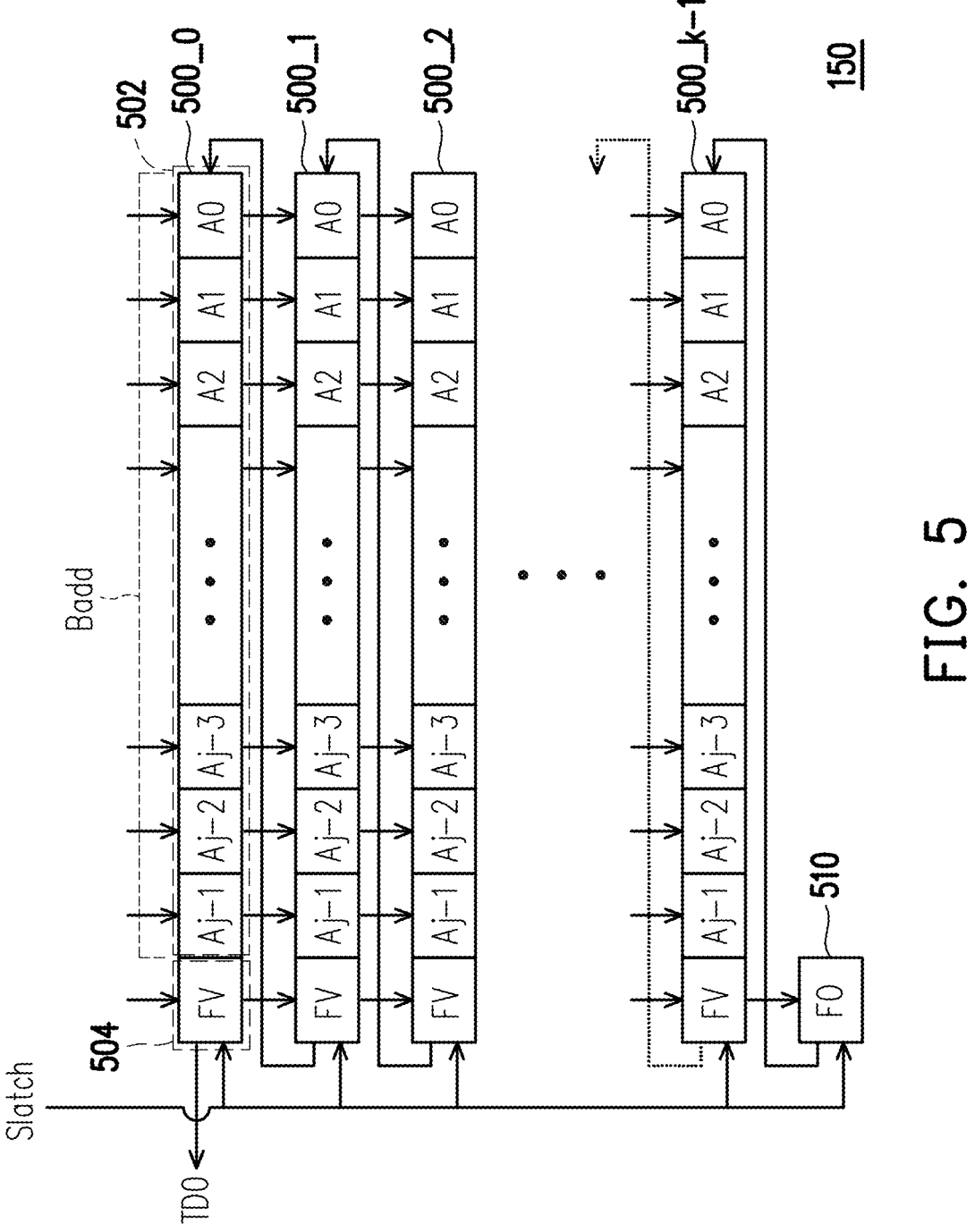
FIG. 5 is a schematic structural diagram of a row address latch according to an embodiment of the disclosure.

In an embodiment, the row address latch 150 is, for example, composed of a stacked memory structure, and has a characteristic of first-in-last-out (FILO). For example, as shown in FIG. 5, the row address latch 150 includes k shift registers 500_0 to 500_$k$–1 and an overflow register 510.

Each shift register 500_0-500_$k$–1 includes a plurality of address bits 502 and a valid bit 504. The address bits 502 are configured to store bad row addresses Badd composed of binary values A0-Aj–1. The valid bit 504 is configured to store a valid flag FV indicating whether the corresponding plurality of address bits 502 are valid. k and j are respectively positive integers greater than 1. The overflow register 510 is configured to store an overflow flag FO indicating whether the row address latch 150 overflows.

Before testing the word line leakage current of the word lines WL0-WLn–1, all registers in the row address latch 150 need to be reset to logic 0 first. During the test period of the word lines WL0-WLn–1, the bad row address Badd may be input to the row address latch 150 in parallel and latched to the shift registers 500_0-500_$k$–1 in sequence. At this time, the valid flag FV of the shift register storing the bad row address Badd may be set to logic 1.

After the test of the word lines WL0-WLn–1 is completed, the bad row address Badd is serially output from the uppermost shift register 500_0 through the output pin TDO in a first-in-last-out manner. In this way, a word line repair process may be automatically performed according to the bad row address Badd, for example, a spare bit line is used to replace a regular bit line corresponding to the bad row address Badd in a fuse blowing manner, which is easily matched with procedures of post-package-repair (PPR), built-in self-test (BIST) and built-in self-repair (BISR) for execution.

In addition, when all shift registers 500_0-500_$k$–1 have stored the bad row addresses Badd, the overflow flag FO may be set to logic 1 to indicate that a storage space of the row address latch 150 is full and new bad row address Badd cannot be stored.

Figure 6:
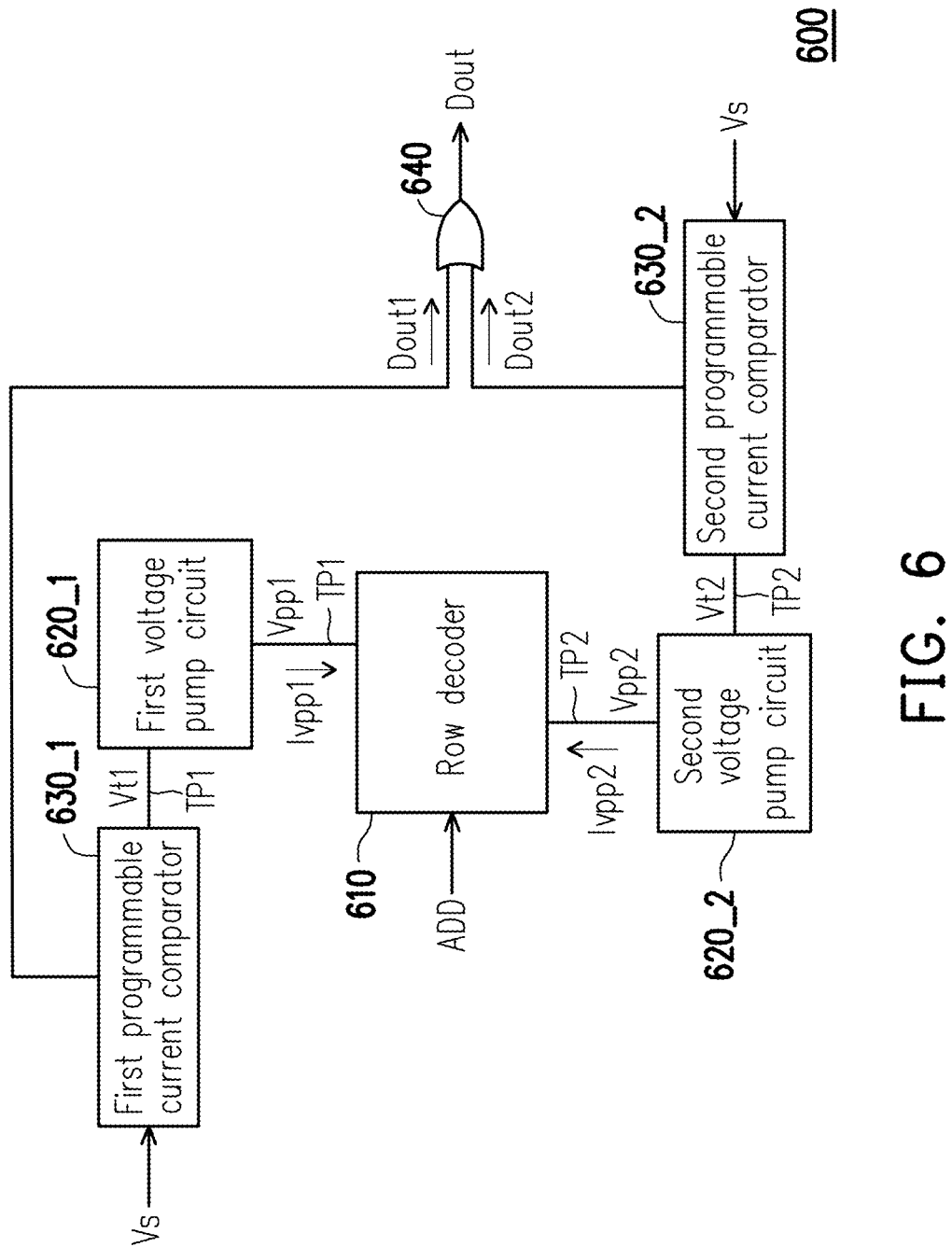
FIG. 6 is a partial schematic circuit diagram of a semiconductor memory device according to another embodiment of the disclosure.

In an embodiment, the bit lines of different blocks may be tested by different programmable current comparators due to different design methods. As shown in FIG. 6, a semiconductor memory device 600 includes a row decoder 610, a first voltage pump circuit 620_1, a second voltage pump circuit 620_2, a first programmable current comparator 630_1, a second programmable current comparator 630_2, and an OR gate 640.

The row decoder 610 is coupled between the word lines corresponding to the first programmable current comparator 630_1 and the first test path TP1, and is coupled between the word lines corresponding to the second programmable current comparator 630_2 and the second test path TP2. The row decoder 610 may decode the row address data ADD, and use the corresponding word line as the test word line WLt for electrically connecting the first test path TP1 or the second test path TP2 according to the decoding result.

The first voltage pump circuit 620_1 is configured on the test path TP1. The first voltage pump circuit 620_1 may receive an operating voltage Vt1 for adjusting, and apply a test voltage Vpp1 to the test word line WLt electrically connected to the first test path TP1.

The second voltage pump circuit 620_2 is configured on the test path TP2. The second voltage pump circuit 620_2 may receive an operating voltage Vt2 for adjusting, and apply a test voltage Vpp2 to the test word line WLt electrically connected to the second test path TP2.

The first programmable current comparator 630_1 is coupled to the first test path TP1. The first programmable current comparator 630_1 may transmit the operating voltage Vt1 to the first voltage pump circuit 620_1 according to the received supply voltage Vs. Furthermore, the first programmable current comparator 630_1 may compare a test current Ivpp1 flowing through the first test path TP1 with the corresponding programmable reference current to output a first test result signal Dout1 to the OR gate 640.

The second programmable current comparator 630_2 is coupled to the second test path TP2. The second programmable current comparator 630_2 may transmit the operating voltage Vt2 to the second voltage pump circuit 620_2 according to the received supply voltage Vs. Furthermore, the second programmable current comparator 630_2 may compare a test current Ivpp2 flowing through the second test path TP2 with the corresponding programmable reference current to output a second test result signal Dout2 to the OR gate 640.

A first input terminal of the OR gate 640 receives the first test result signal Dout1 from the first programmable current comparator 630_1, a second input terminal receives the second test result signal Dout2 from the second programmable current comparator 630_2, and an output terminal provides the test result signal Dout. Through the circuit structure described above, multiple programmable current comparators may be provided in the semiconductor memory device to test the bit lines of different blocks.

It should be noted that, according to different design methods, the preset equivalent resistances Rsen of the first programmable current comparator 630_1 and the second programmable current comparator 630_2 may be the same or different. The supply voltage Vs received by the first programmable current comparator 630_1 and the second programmable current comparator 630_2 may also be the same or different. In addition, the row decoder 610 may be split into multiple decoders to respectively couple different test paths to test corresponding multiple word lines.

Furthermore, although this embodiment is described with reference to the semiconductor memory device including two voltage pump circuits and two programmable current comparators, the number of the above components is not limited to the disclosure. Those skilled in the art may deduce the number of the above components to be more according to their actual needs and with reference to the teachings of the embodiment.

Referring to FIG. 7, in the embodiment, the testing method of the semiconductor memory device includes the following steps. A row address data is decoded by a row decoder, and a test word line is selected from a plurality of word lines to be electrically connected to a test path (step S700). An operating voltage obtained according to a supply voltage is obtained for adjusting, and a test voltage is applied to the test word line through the test path (step S702). A test current flowing through the test path is compared with a programmable reference current to provide a test result signal (step S704). The corresponding test current is compared with the programmable reference current by using the word lines as the test word line sequentially according to an operating command, and whether the test word line is defective is determined according to the test result signal (step S706). For implementation details of the above steps S700, S702, S704 and S706, reference may be made to the embodiments of FIG. 1 to FIG. 6, and details thereof are not repeated here.

It should be noted that although the test method of the embodiment is mainly aimed at word line leakage current, the disclosure is not limited thereto, and it may also be applied to other types of leakage detection on word lines through appropriate timing arrangements and required voltage settings.

In summary, the semiconductor memory device and the test method thereof of the disclosure are adapted to simplify the test of high-impedance word line leakage current into functional test without the need for additional DC test. In this way, not only a test time is greatly reduced, but also the DC test may be introduced into standard test projects for mass production to filter out defective components, so as to improve product reliability.

What is claimed is:

1. A semiconductor memory device, comprising:
a plurality of word lines;
a row decoder, coupled between the word lines and a first test path, decoding a row address data and accordingly selecting a test word line from the word lines to be electrically connected to the first test path;
a first voltage pump circuit, configured on the first test path, receiving an operating voltage for adjusting, and applying a test voltage to the test word line;
a first programmable current comparator, coupled to the first test path, transmitting the operating voltage to the first voltage pump circuit according to a received supply voltage, and comparing a test current flowing through the first test path with a programmable reference current to provide a test result signal; and
a control circuit, coupled to the row decoder and the first programmable current comparator, comparing the corresponding test current with the programmable reference current by using the word lines as the test word line sequentially through the first programmable current comparator according to an operating command, and determining whether the test word line is defective according to the corresponding test result signal.

2. The semiconductor memory device according to claim 1, wherein when the test result signal is at a first logic level, the test word line is indicated to be defective, and when the test result signal is at a second logic level, the test word line is indicated to be good.

3. The semiconductor memory device according to claim 1, wherein the control circuit provides a setting signal to the first programmable current comparator to adjust the programmable reference current according to the setting signal.

4. The semiconductor memory device according to claim 3, wherein the setting signal comprises a first setting signal, a second setting signal, a third setting signal and a fourth setting signal, and the first programmable current comparator comprises:
an input node, receiving the supply voltage;
an output node, coupled to the first test path, and configured to output the operating voltage;
a first switch, coupled between the input node and the output node, and controlled by the first setting signal to be turned on or off;
a first resistor, connected in series with the first switch on a first circuit path between the input node and the output node;

a second switch, coupled between the input node and the output node, and controlled by the second setting signal to be turned on or off;
a second resistor, connected in series with the second switch on a second circuit path between the input node and the output node;
a third switch, coupled between the input node and the output node, and controlled by the third setting signal to be turned on or off;
a third resistor, connected in series with the third switch on a third circuit path between the input node and the output node;
a fourth switch, coupled between the input node and the output node, and controlled by the fourth setting signal to be turned on or off;
a fourth resistor, having a first terminal coupled to the input node;
a fifth resistor, having a first terminal coupled to the output node;
a first comparator, having a non-inverting input terminal coupled to a second terminal of the fourth resistor, and an inverting input terminal coupled to a second terminal of the fifth resistor;
a second comparator, having a non-inverting input terminal coupled to an output terminal of the first comparator, an inverting input terminal receiving a reference voltage, and an output terminal configured to output the test result signal; and
a sixth resistor, having a first terminal coupled to the non-inverting input terminal of the first comparator, and a second terminal coupled to the non-inverting input terminal of the second comparator.

5. The semiconductor memory device according to claim 1, further comprising:
a row address latch, coupled to the row decoder, the first programmable current comparator, and the control circuit, and taking a current row address of the row decoder as a bad row address for storing in response to a latch pulse signal output by the control circuit when the test result signal is in a first logic level.

6. The semiconductor memory device according to claim 5, wherein the row address latch is composed of a stacked memory structure, and comprises a plurality of shift registers, and each of the shift registers comprises:
a plurality of address bits, configured to store the bad row address; and
a valid bit, configured to store a valid flag indicating whether the corresponding address bit is valid.

7. The semiconductor memory device according to claim 6, wherein the row address latch further comprises:
an overflow register, configured to store an overflow flag indicating whether the row address latch is overflow.

8. The semiconductor memory device according to claim 1, wherein after the test voltage is received by the test word line, after a detection time, the control circuit outputs an execution pulse signal to the first programmable current comparator to start comparing the test current and the programmable reference current.

9. The semiconductor memory device according to claim 1, wherein during a test period of the test word line, the control circuit controls the row decoder to disable the word lines adjacent to the test word line.

10. The semiconductor memory device according to claim 1, further comprising:
a refresh counter, coupled to the row decoder and the control circuit, configured to increment the row address data in a test mode and sequentially output the incremented row address data to the row decoder.

11. The semiconductor memory device according to claim 1, further comprising:

a second voltage pump circuit, configured on a second test path coupled to the row decoder, receiving an operating voltage for adjusting, and applying a test voltage to the test word line;

a second programmable current comparator, coupled to the second test path, transmitting the operating voltage to the second voltage pump circuit according to the received supply voltage, and comparing a test voltage flowing through the second test path with the programmable reference current to output a second test result signal; and an OR gate, having a first input terminal receiving a first test result signal from the first programmable current comparator, a second input terminal receiving the second test result signal from the second programmable current comparator, and an output terminal providing the test result signal.

12. A test method of a semiconductor memory device, wherein the semiconductor memory device comprises a plurality of word lines and a row decoder, the row decoder is coupled between the word lines and a test path, the test method comprising:

decoding a row address data by the row decoder, and accordingly selecting a test word line from the word lines to be electrically connected to the test path;

receiving an operating voltage obtained according to a supply voltage for adjusting, and applying a test voltage to the test word line through the test path;

comparing a test current flowing through the test path with a programmable reference current to provide a test result signal; and comparing the corresponding test current with the programmable reference current by using the word lines as the test word line sequentially according to an operating command, and determining whether the test word line is defective according to the corresponding test result signal.

13. The test method according to claim 12, wherein when the test result signal is at a first logic level, the test word line is indicated to be defective, and when the test result signal is at a second logic level, the test word line is indicated to be good.

14. The test method according to claim 12, further comprising:

adjusting the programmable reference current according to a setting signal.

15. The test method according to claim 12, further comprising:

taking a current row address of the row decoder as a bad row address for storing to a row address latch in response to a latch pulse signal when the test result signal is in a first logic level.

16. The test method according to claim 15, wherein the row address latch is composed of a stacked memory structure, and comprises a plurality of shift registers, and each of the shift registers comprises:

a plurality of address bits, configured to store the bad row address; and a valid bit, configured to store a valid flag indicating whether the corresponding address bit is valid.

17. The test method according to claim 16, wherein the row address latch further comprises:

an overflow register, configured to store an overflow flag indicating whether the row address latch is overflow.

18. The test method according to claim 12, wherein the step of comparing the test current flowing through the test path with the programmable reference current comprises:

starting comparing the test current and the programmable reference current after the test word line receives the test voltage and after a detection time.

19. The test method according to claim 12, further comprising:

controlling the row decoder to disable the word lines adjacent to the test word line during a test period of the test word line.

20. The test method according to claim 12, wherein the step of comparing the corresponding test current with the programmable reference current by using the word lines as the test word line sequentially according to the operating command comprises:

incrementing the row address data in a test mode and sequentially outputting the incremented row address data to the row decoder.

\*    \*    \*    \*    \*